(12) United States Patent
Razdan et al.

(10) Patent No.: US 10,564,352 B1
(45) Date of Patent: Feb. 18, 2020

(54) PHOTONIC INTEGRATED CIRCUIT BONDED WITH INTERPOSER

(71) Applicant: Cisco Technology, Inc., San Jose, CA (US)

(72) Inventors: Sandeep Razdan, Burlingame, CA (US); Ashley J. Maker, Pleasanton, CA (US); Matthew J. Traverso, Santa Clara, CA (US); Mark A. Webster, Bethlehem, PA (US); Jock T. Bovington, La Mesa, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 16/543,441

(22) Filed: Aug. 16, 2019

Related U.S. Application Data

(63) Continuation of application No. 16/172,702, filed on Oct. 26, 2018, now Pat. No. 10,393,959.

(51) Int. Cl.
| | |
|---|---|
| *G02B 6/12* | (2006.01) |
| *G02B 6/122* | (2006.01) |
| *G02B 6/13* | (2006.01) |
| *G02B 6/42* | (2006.01) |
| *G02B 6/30* | (2006.01) |

(Continued)

(52) U.S. Cl.
CPC ....... *G02B 6/12004* (2013.01); *G02B 6/1225* (2013.01); *G02B 6/13* (2013.01); *G02B 6/30* (2013.01); *G02B 6/428* (2013.01); *G02B 6/4248* (2013.01); *G02B 6/43* (2013.01); *H01L 23/5384* (2013.01); *H01L 24/09* (2013.01); *H01L 24/17* (2013.01); *H01L 24/73* (2013.01)

(58) Field of Classification Search
CPC ........ G02B 6/12004; G02B 6/30; G02B 6/43; G02B 6/13; G02B 6/428; G02B 6/4248; G02B 6/1225; H01L 24/17; H01L 23/5384; H01L 24/09; H01L 24/73
See application file for complete search history.

(56) References Cited

U.S. PATENT DOCUMENTS

| | | |
|---|---|---|
| 4,322,778 A | 3/1982 | Barbour et al. |
| 9,335,500 B2 | 5/2016 | McLaren et al. |

(Continued)

OTHER PUBLICATIONS

Chou et al., "Modeling, Design, and Demonstration of Ultra-miniaturized and High Efficiency 3D Glass Photonic Modules," 2014 Electronic Components & Technology Conference, 6 pages.

(Continued)

*Primary Examiner* — John Bedtelyon
(74) *Attorney, Agent, or Firm* — Patterson + Sheridan, LLP

(57) ABSTRACT

Aspects described herein include a method comprising forming an insulator layer above a silicon layer of a silicon-on-insulator (SOI) substrate. A first optical device is formed partly in the silicon layer and partly in the insulator layer. A first optical waveguide is formed in the insulator layer and optically coupled with the first optical device. The method further comprises forming conductive contacts extending partly through the insulator layer to the first optical device, bonding a first surface of an interposer with a top surface of the insulator layer, and forming, from a second surface of the interposer opposite the first surface, a plurality of first conductive vias extending at least partly through the interposer. The plurality of first conductive vias are coupled with the conductive contacts.

20 Claims, 13 Drawing Sheets

(51) Int. Cl.
*G02B 6/43* (2006.01)
*H01L 23/538* (2006.01)
*H01L 23/00* (2006.01)

(56) References Cited

U.S. PATENT DOCUMENTS 9,786,641 B2 10/2017 Budd et al.
9,791,640 B2 10/2017 Bowen et al.
9,864,133 B2 1/2018 Patel et al.

OTHER PUBLICATIONS gazettabyte.com, "Packaging silicon photonics using passive alignment," May 31, 2017 [Accessed Online Oct. 23, 2018] http://www.gazettabyte.com/home/2017/5/31/packaging-silicon-photonics-using-passive-alignment.html.
U.S. Appl. No. 16/172,702, "Photonic Integrated Circuit Bonded With Interposer," filed Oct. 26, 2018.

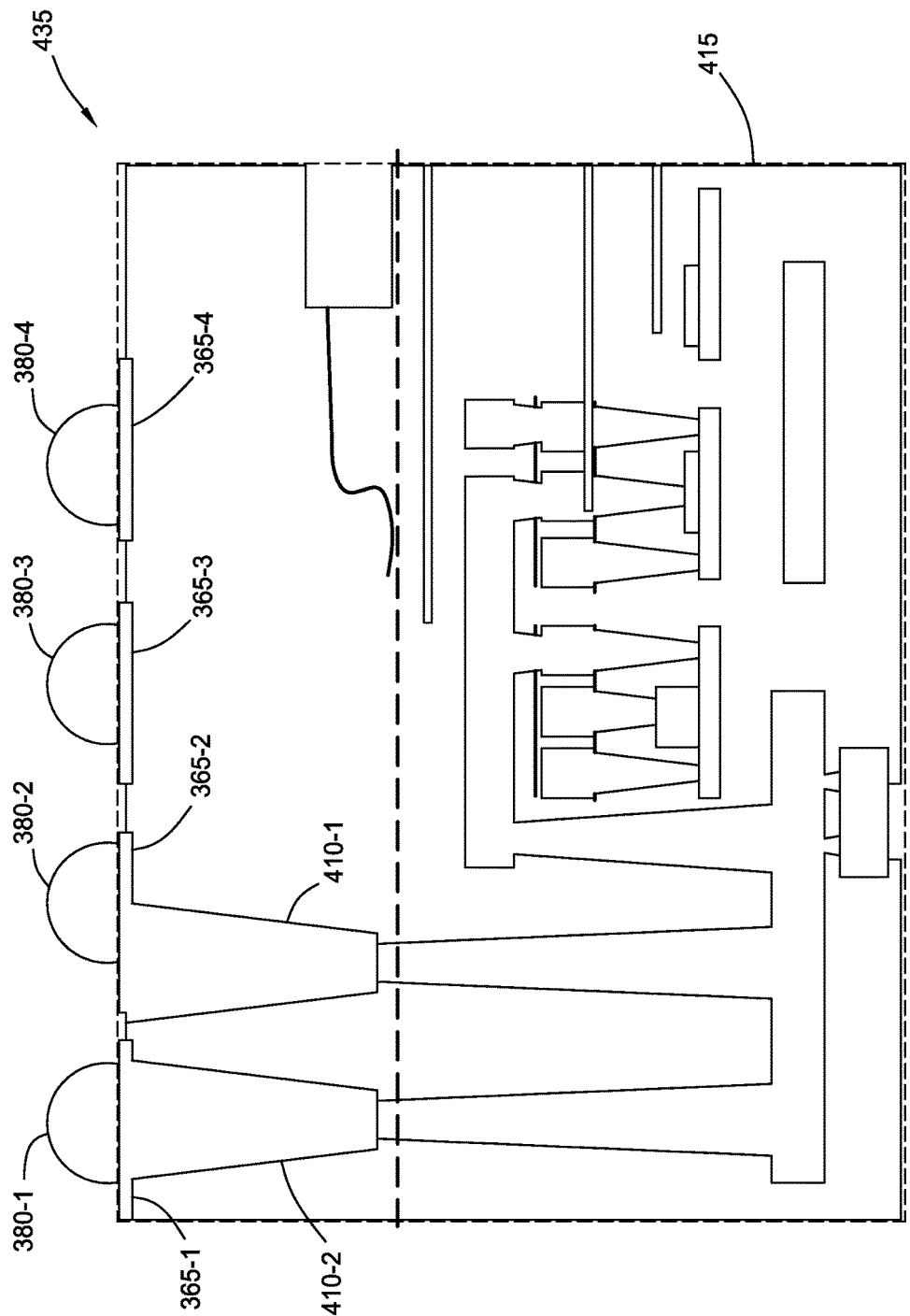

PHOTONIC INTEGRATED CIRCUIT BONDED WITH INTERPOSER

CROSS-REFERENCE TO RELATED APPLICATIONS

This application is a continuation of co-pending U.S. patent application Ser. No. 16/172,702, filed Oct. 26, 2018. The aforementioned related patent application is herein incorporated by reference in its entirety.

TECHNICAL FIELD

Embodiments presented in this disclosure generally relate to optical networking, and more specifically, to an interposer capable of supporting power connections and higher frequency signal connections to a photonic integrated circuit (IC).

BACKGROUND

Electrical connections providing power and signaling to photonic chips typically include wire bonding to a printed circuit board (PCB) or other substrate. However, with increasing bandwidths, maintaining power and signal integrity may be difficult with wire bonding. Further, multi-chip integration (e.g., a photonic IC, an analog IC, a digital signal processor (DSP), and so forth) may be difficult due to a limited scalability of wire bonding. For example, wire bonds may be limited to edge connections, may require more complex on-chip routing, may occupy a relatively large chip and package footprint, and/or may be more susceptible to cross-talk and IR drop.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

FIGS. 4A-4D illustrate an exemplary sequence of fabricating an optical apparatus using a preprocessed interposer wafer, according to one or more embodiments.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1:
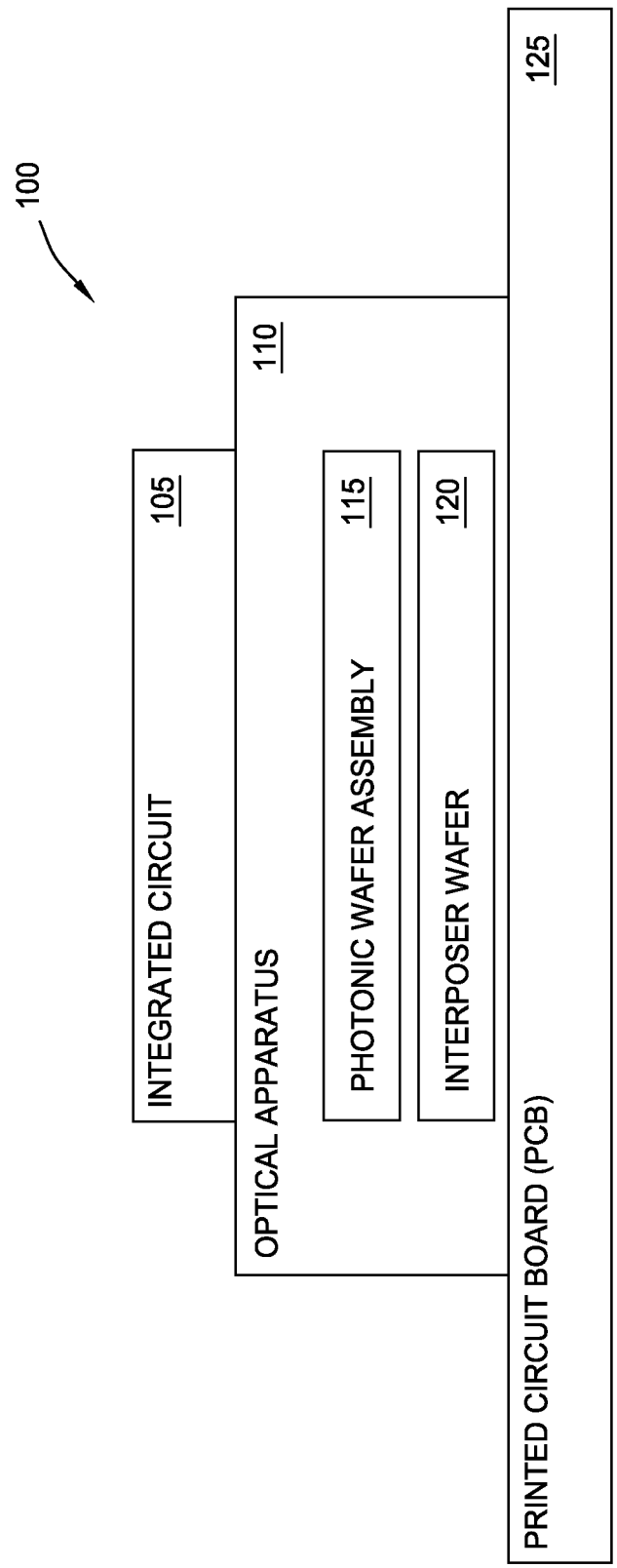
FIG. 1 is a block diagram of an optical apparatus with an exemplary interposer wafer, according to one or more embodiments.

One embodiment presented in this disclosure is a method comprising forming an insulator layer above a silicon layer of a silicon-on-insulator (SOI) substrate. A first optical device is formed partly in the silicon layer and partly in the insulator layer, and a first optical waveguide is formed in the insulator layer and optically coupled with the first optical device. The method further comprises forming conductive contacts extending partly through the insulator layer to the first optical device, bonding a first surface of an interposer with a top surface of the insulator layer, and forming, from a second surface of the interposer opposite the first surface, a plurality of first conductive vias extending at least partly through the interposer. The plurality of first conductive vias are coupled with the conductive contacts.

Another embodiment is an optical apparatus comprising a silicon layer of a silicon-on-insulator (SOI) substrate, an insulator layer formed above the silicon layer, a first optical device formed partly in the silicon layer and partly in the insulator layer, conductive contacts extending partly through the insulator layer to the first optical device, an interposer having a first surface bonded with a top surface of the insulator layer, and a plurality of first conductive vias extending, from a second surface of the interposer opposite the first surface, at least partly through the interposer. The plurality of first conductive vias are coupled with the conductive contacts.

Another embodiment is an apparatus comprising a silicon layer of a silicon-on-insulator (SOI) substrate, an insulator layer formed above the silicon layer, a first optical device formed partly in the silicon layer and partly in the insulator layer, a first optical waveguide formed in the insulator layer and optically coupled with the first optical device, conductive contacts extending partly through the insulator layer to the first optical device, an interposer having a first surface bonded with a top surface of the insulator layer, and a plurality of first conductive vias extending, from a second surface of the interposer opposite the first surface, at least partly through the interposer. The plurality of first conductive vias are coupled with the conductive contacts. The apparatus further comprises a plurality of first conductive pads formed at the second surface of the interposer. The plurality of first conductive pads are coupled with the plurality of first conductive vias. The apparatus further comprises an integrated circuit coupled with the one or more first conductive pads.

Example Embodiments

According to various embodiments discussed herein, a method of fabricating an optical apparatus comprises bonding a first surface of an interposer wafer with a first exterior surface of a photonic wafer assembly. The photonic wafer assembly comprises one or more optical devices coupled with one or more metal layers and with one or more first optical waveguides. The method further comprises forming, from a second surface of the interposer wafer opposite the first surface, a plurality of first conductive vias extending at least partway through the interposer wafer. The plurality of first conductive vias are coupled with the one or more metal layers. The method further comprises forming, at the second surface, a plurality of first conductive pads coupled with the plurality of first conductive vias. The method further comprises forming one or more second conductive pads coupled with the one or more metal layers. The one or more second conductive pads are accessible at a second exterior surface of the photonic wafer assembly opposite the first exterior surface.

Beneficially, the interposer wafer supports electrical and/or optical connections between the photonic wafer assembly and a PCB. Use of the interposer wafer mitigates some or all of the concerns associated with wire bonding. Further, the material and the dimensioning of the interposer wafer may be selected such that thicker interposers (e.g., up to 1 mm) can be used and one or more conductive vias can extend fully through the interposer wafer, both of which maintain rigidity of the interposer wafer and the whole bonded structure during thermal and/or mechanical stresses.

FIG. 1 is a block diagram 100 of an optical apparatus 110 with an exemplary interposer wafer 120, according to one or more embodiments. The optical apparatus 110 is arranged between an IC 105 and a PCB 125 and provides electrical and/or optical connections therebetween. The IC 105 may be implemented in any suitable form and may include any suitable functionality. Some non-limiting examples of the IC 105 include an analog IC and a DSP IC. Although generally described in terms of a single die and a single interposer, alternate embodiments may include multiple dies and/or multiple interposers.

The electrical and/or optical connections provided by the optical apparatus 110 may include one or more power connections and/or one or more high-speed signal connections. For example, power and high-speed signaling may be communicated between the PCB 125 and the IC 105 through conductive routing in the optical apparatus 110. By providing the one or more power connections and/or the one or more high-speed signal connections through the optical apparatus 110, wire bonding from the photonic wafer assembly 115 and its associated challenges may be mitigated or avoided. For example, using the one or more power connections and/or the one or more signal connections, routing between the PCB 125 and the IC 105 may be achieved with reduced complexity, improved electrical and/or optical performance may be achieved, the optical apparatus 110 may occupy a smaller footprint, and so forth.

The optical apparatus 110 comprises a photonic wafer assembly 115 that is coupled with an interposer wafer 120. In some embodiments, wire bonding may be reduced or avoided by forming conductive vias through the photonic wafer assembly 115 and through the interposer wafer 120. However, forming conductive vias through semiconductor layers or substrates (e.g., through the photonic wafer assembly 115) can be complex and costly. In some cases, the routing may require a conductive redistribution layer (RDL) for arranging connections to the PCB 125. The more complex routing may also correspond to a larger optical apparatus. Further, semiconductor layers or substrates tend to have a relatively low dielectric constant, and may be relatively leaky for high-speed and have high power loss due to smaller trace width and/or sizes available in semiconductor processing. Still further, forming conductive vias through semiconductor layers may require a relatively thin substrate (e.g., 100 microns or less). However, thin substrates tend to contribute to additional stresses and warping of the photonic wafer assembly 115, which can reduce the reliability of the photonic wafer assembly 115.

According to one or more embodiments, the interposer wafer 120 supports electrical and/or optical connections between the photonic wafer assembly 115 and the PCB 125. Use of the interposer wafer 120 mitigates some or all of the concerns associated with wire bonding, as well as forming conductive vias through semiconductor layers.

In some embodiments, the interposer wafer 120 comprises an optically transmissive material, such as a silicate glass or quartz. One or more optical waveguides may be formed in the interposer wafer 120, which supports one or more optical connections between optical devices of the photonic wafer assembly 115 and one or more optical fibers (e.g., included in a fiber array unit (FAU)). In some embodiments, one or more mechanical features are formed into the interposer wafer 120 to support optical coupling of the one or more optical fibers with the one or more optical devices. Some non-limiting examples of the one or more mechanical features include a recessed portion into which the one or more optical fibers are partly received, one or more grooves into which the one or more optical fibers are partly received, and so forth.

In some embodiments, the interposer wafer 120 has one or more optical waveguides formed therein according to any known techniques. In some embodiments, the interposer wafer 120 comprises a silicate glass and the one or more optical waveguides are formed using laser patterning of the silicate glass.

In some embodiments, the interposer wafer 120 comprises one or more conductive vias extending through the interposer wafer 120, which couple the PCB 125 with the photonic wafer assembly 115. Beneficially, the material and the dimensioning (e.g., a thickness) of the interposer wafer 120 are selected such that the one or more conductive vias can extend fully through the interposer wafer 120 while maintaining a rigidity of the interposer wafer 120 during thermal stresses.

The interposer wafer 120 may be coupled to the photonic wafer assembly 115 through any suitable means. In some embodiments, the interposer wafer 120 is bonded to the photonic wafer assembly 115 through oxide-oxide bonding at the wafer level (e.g., a silicate glass interposer wafer 120 with an oxide layer of the photonic wafer assembly 115). In some embodiments, a relatively thin layer of oxide is deposited on the surface of the interposer wafer 120 to improve bonding with the photonic wafer assembly 115.

The optical apparatus 110 may be coupled with the PCB 125 through any suitable surface mounting techniques. In some embodiments, a plurality of solder balls are attached to the interposer wafer 120 and couple with circuitry of the PCB 125 in a ball grid array.

Thus, the interposer wafer 120 when bonded with the photonic wafer assembly 115 provides embedded electrical and/or optical interconnects that can be used to carry electrical power, high-speed electrical signals, and/or optical signals through the interposer wafer 120. In this way, wire bond interconnects may be eliminated and the electrical routing simplified to provide better signal integrity, lower resistive losses, and a smaller overall package size.

Figure 2A:
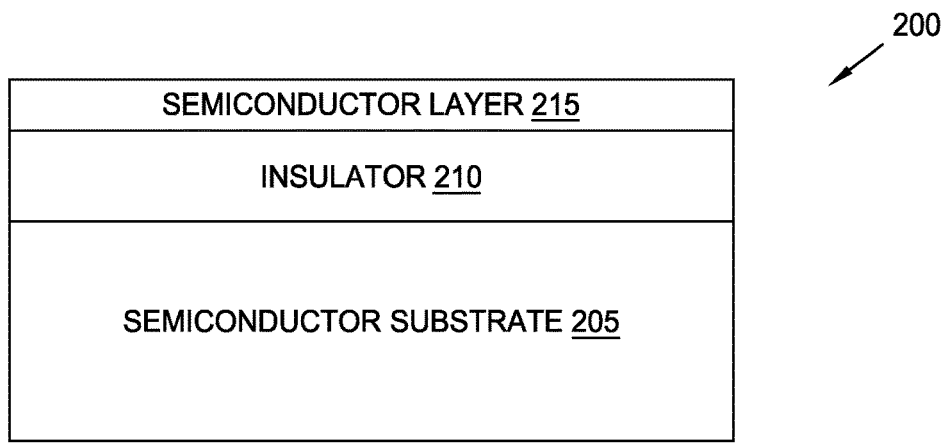
FIGS. 2A-2C illustrate an exemplary sequence of fabricating a photonic wafer assembly, according to one or more embodiments.
Figure 2B:
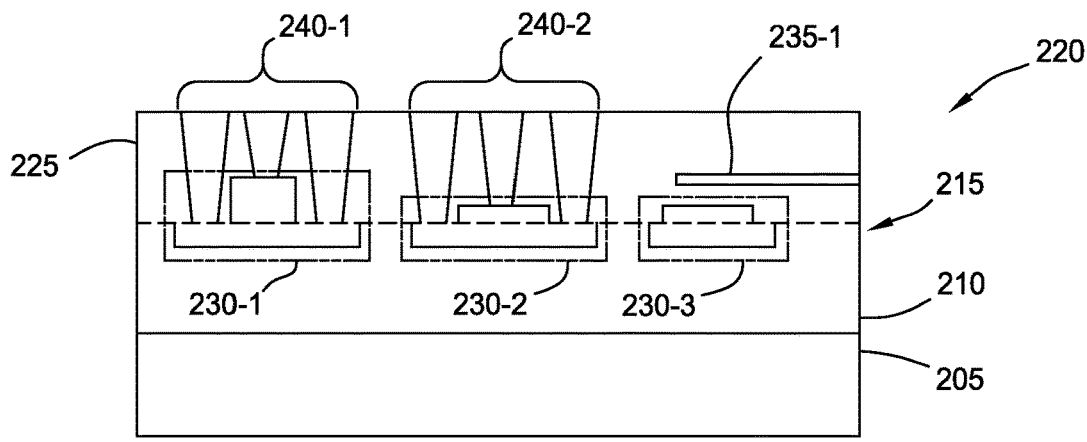
Figure 2C:
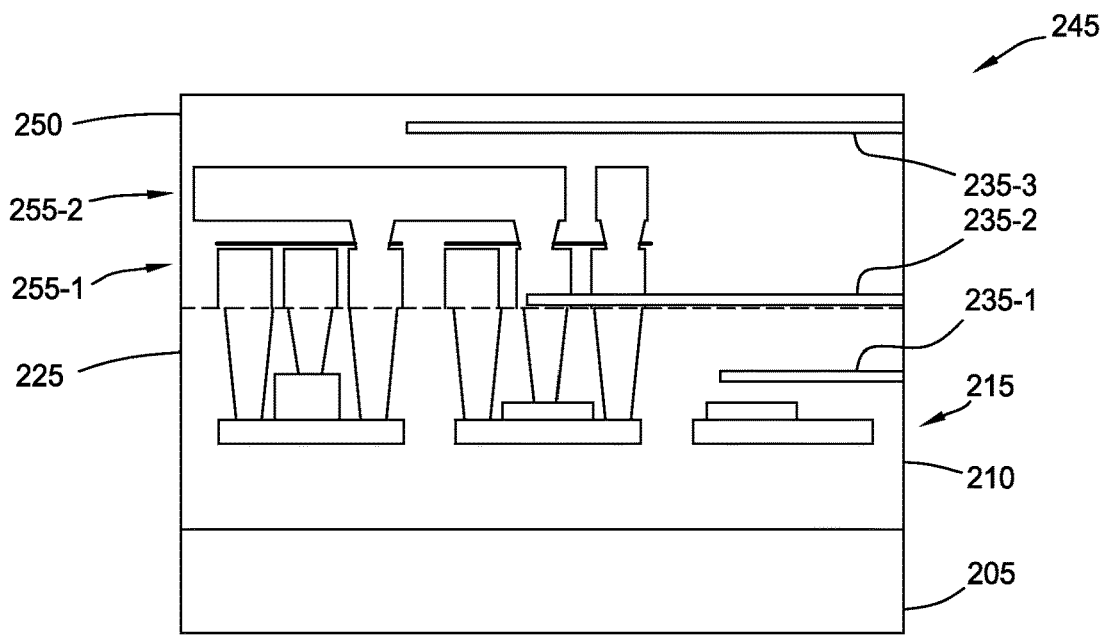
Figure 3A:
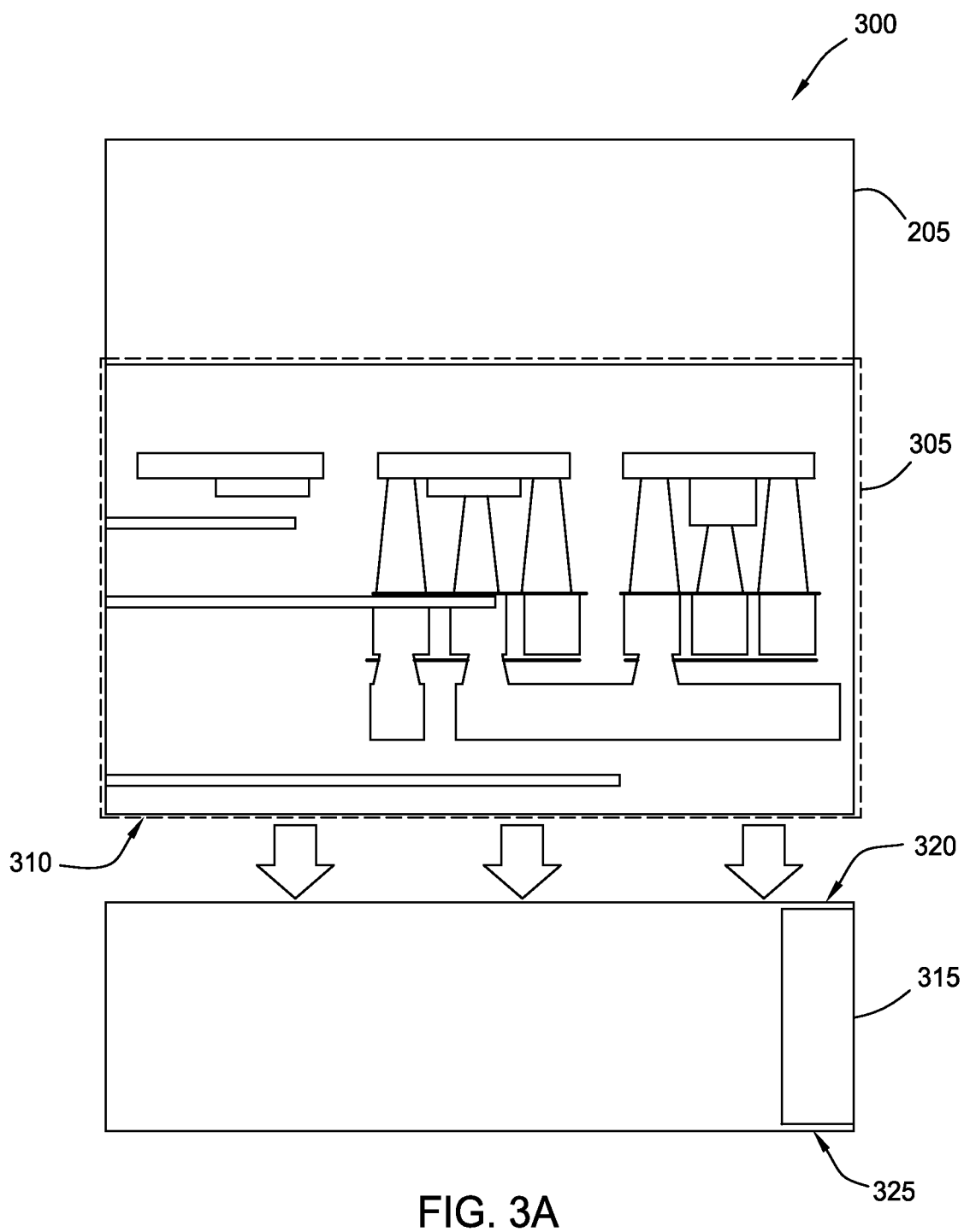
FIGS. 3A-3E illustrate an exemplary sequence of fabricating an optical apparatus using a blank interposer wafer, according to one or more embodiments.
Figure 3B:
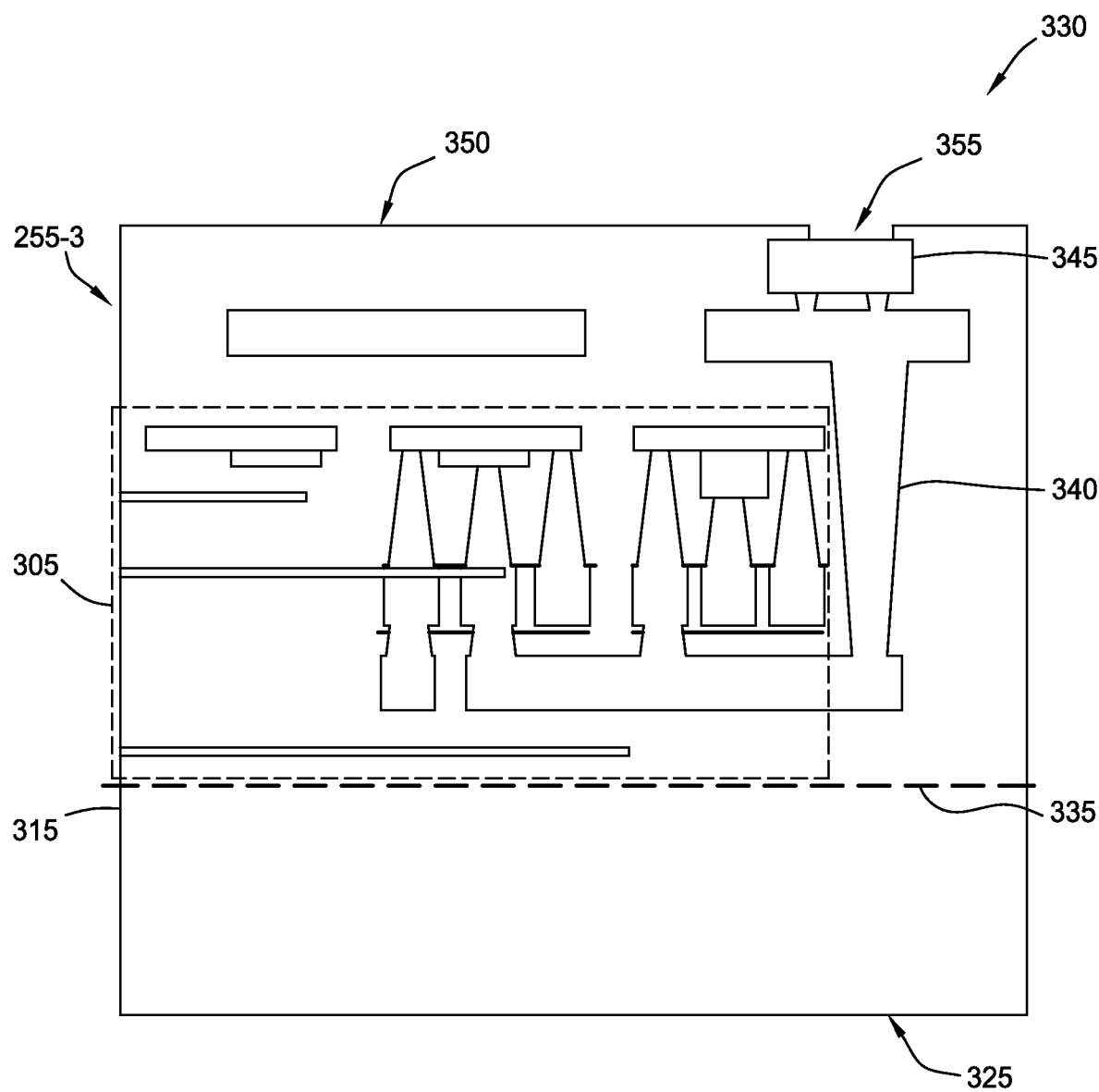
Figure 3C:
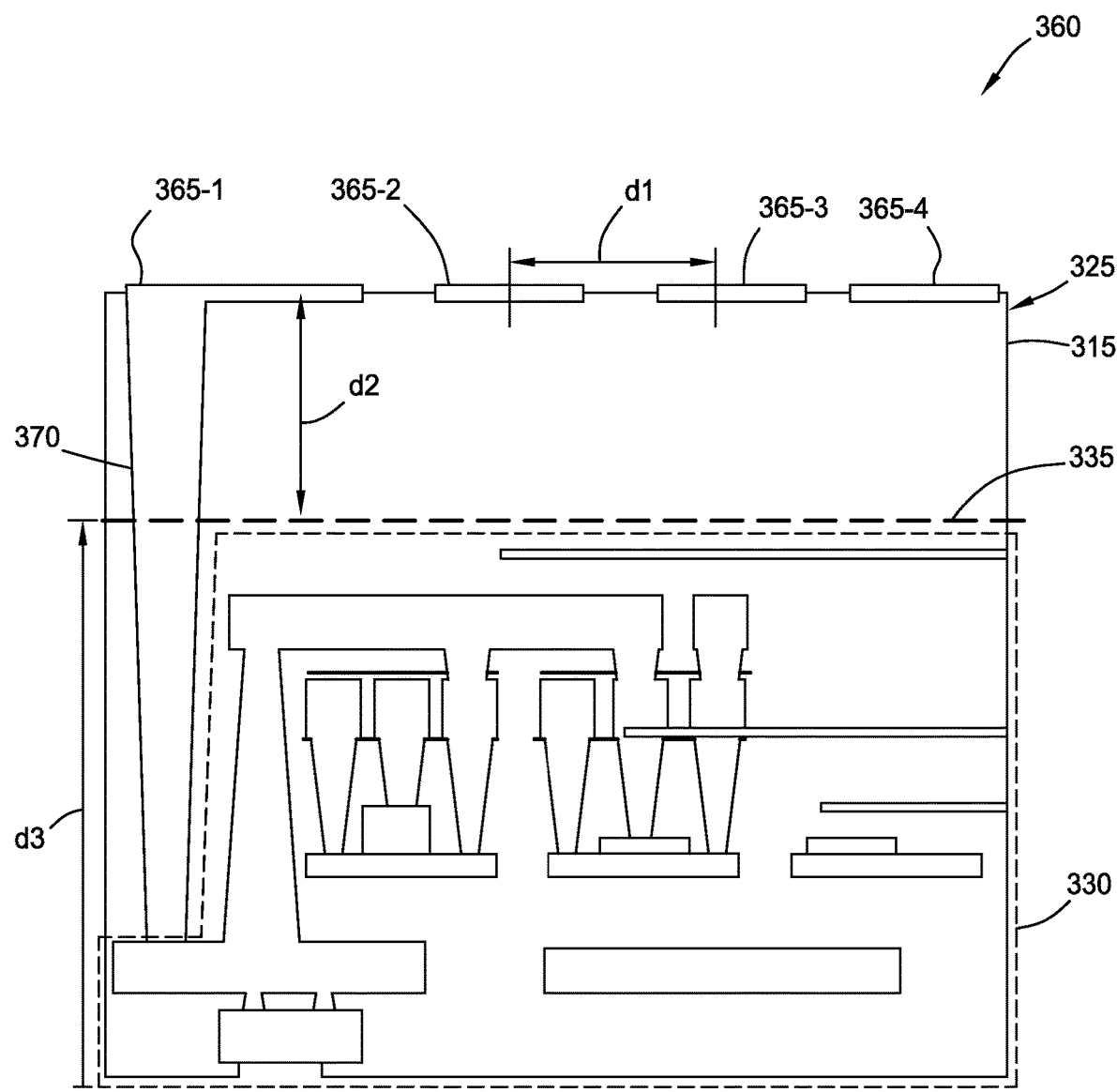
Figure 3D:
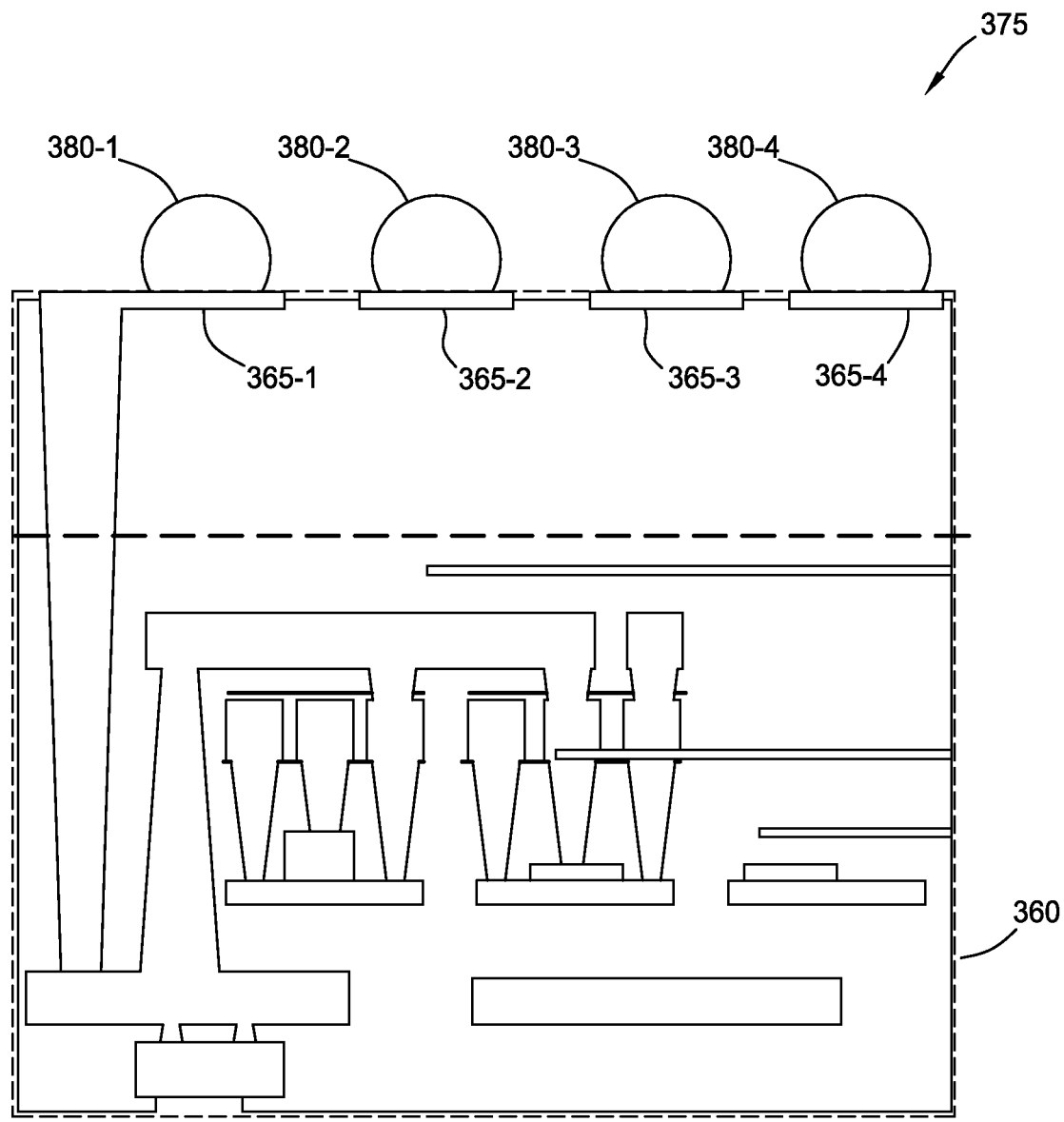
Figure 3E:
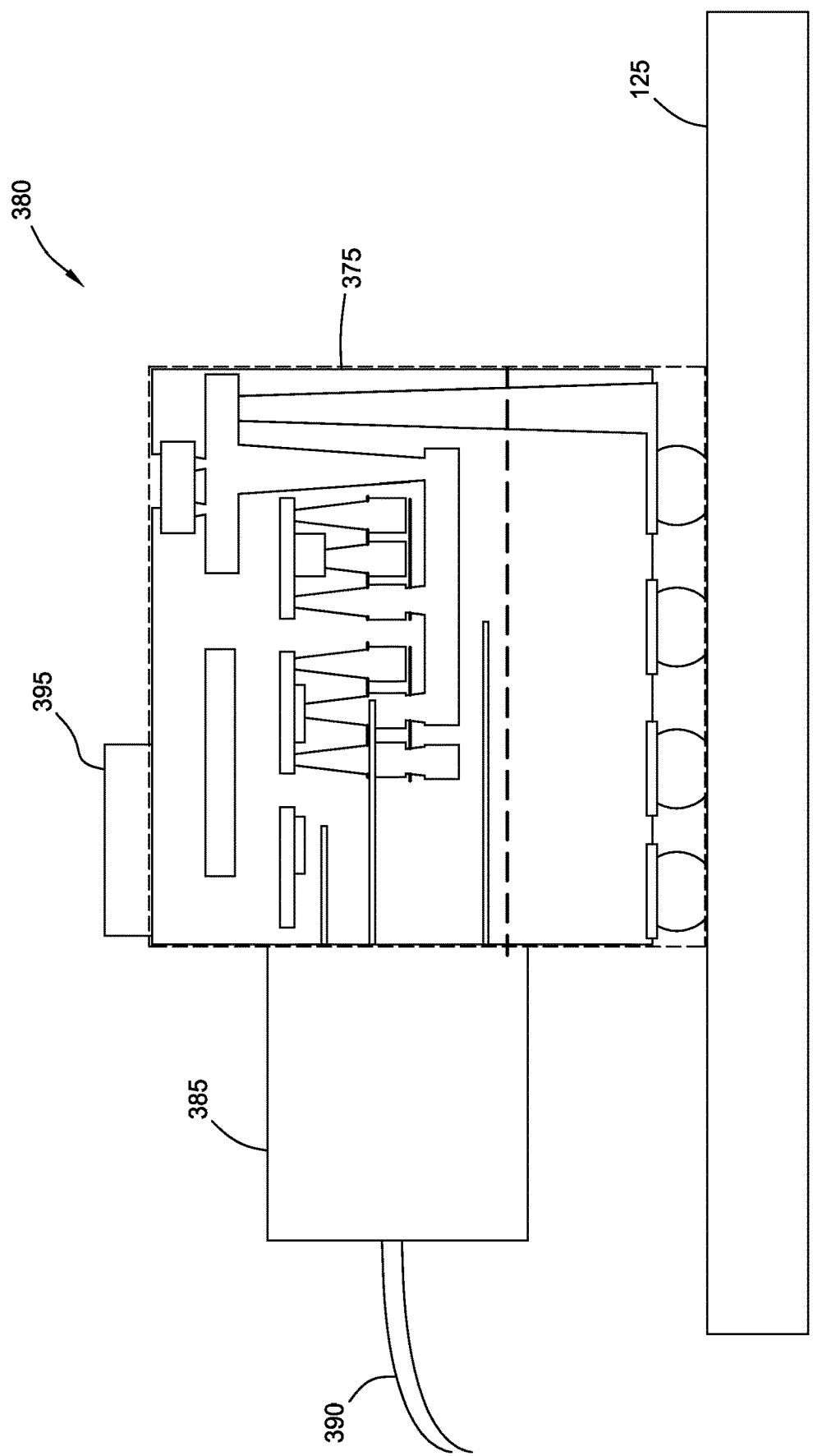
Figure 4A:
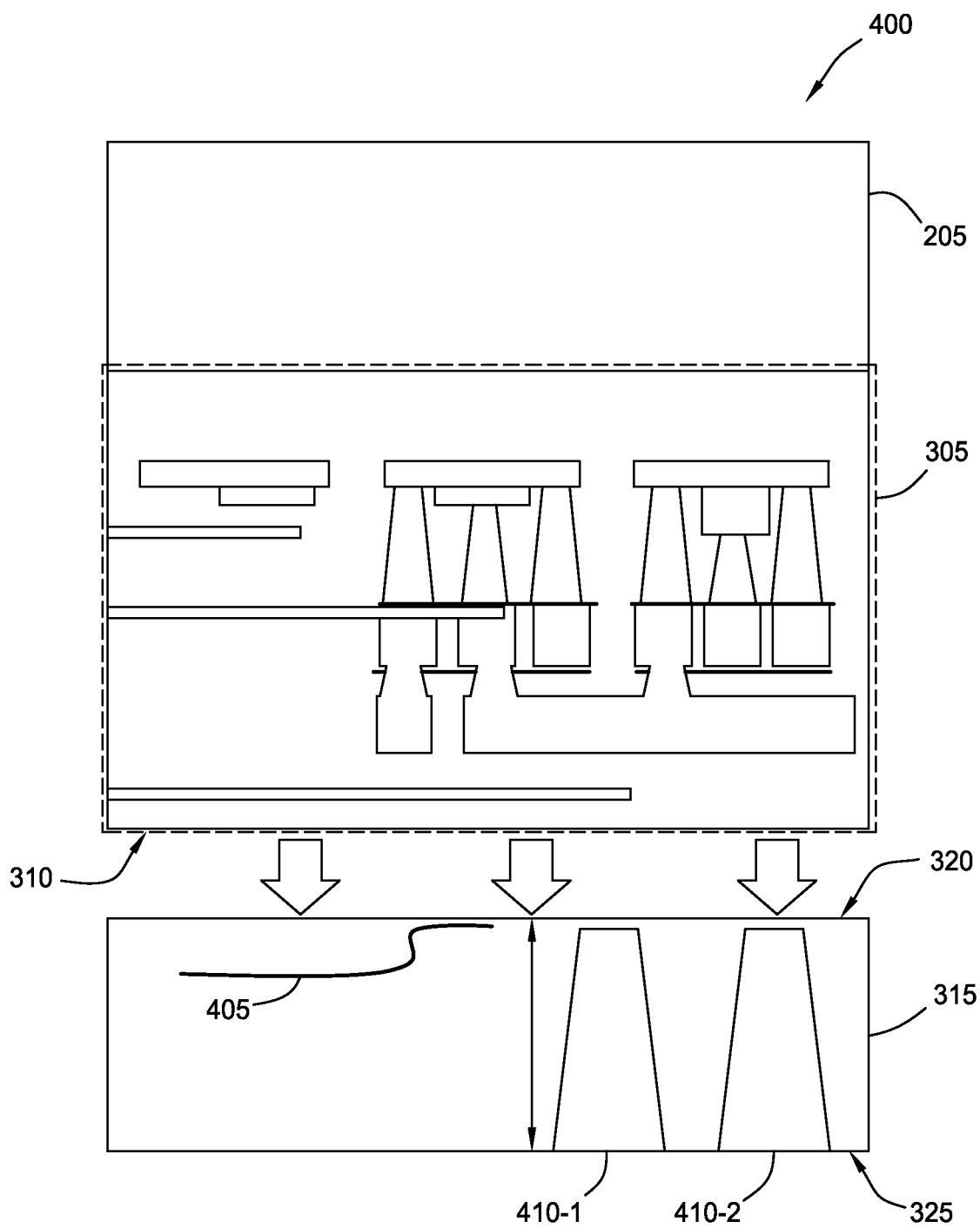
Figure 4B:
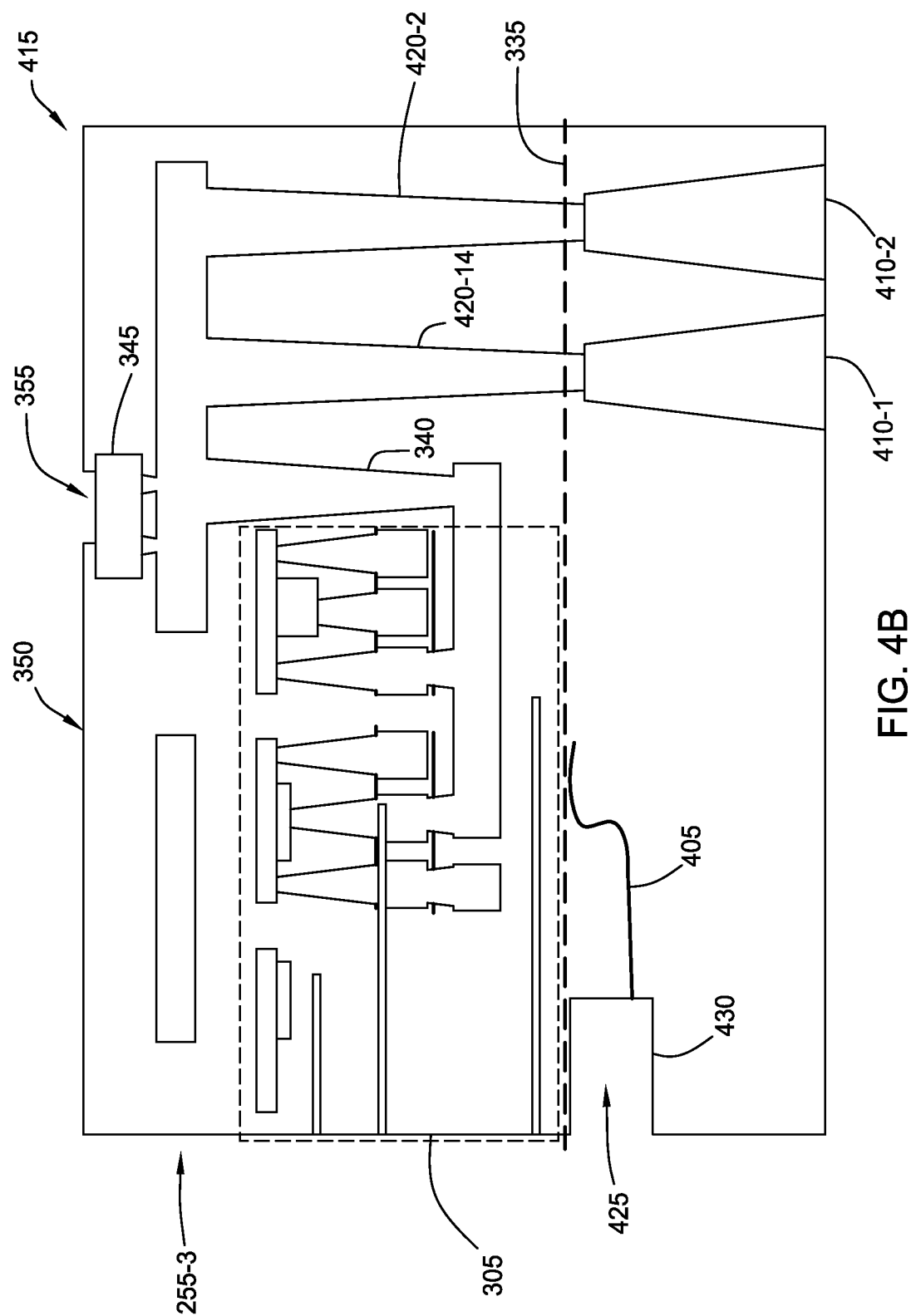
Figure 4D:
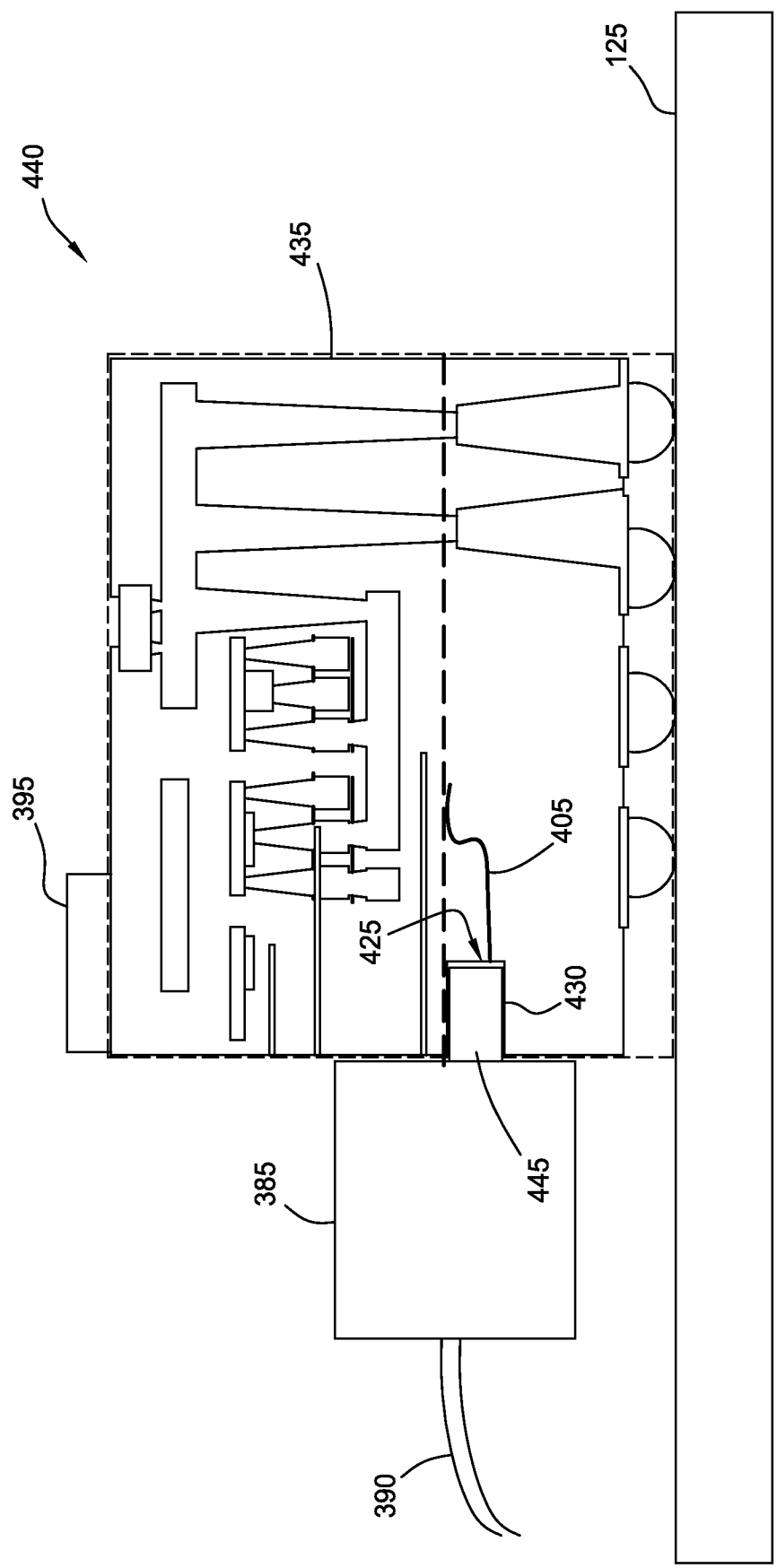

FIGS. 2A-2C illustrate an exemplary sequence of fabricating a photonic wafer assembly 260, according to one or more embodiments. Although described in terms of a single silicon-on-insulator (SOI) device, the various techniques discussed herein may be applied at wafer level to form a plurality of SOI devices prior to dicing into individual SOI devices.

Diagram 200 illustrates a silicon-on-insulator (SOI) device comprising a semiconductor substrate 205, an insulator layer 210 (also referred to as an oxide layer or a buried oxide layer (BOX)), and a semiconductor layer 215. Although the embodiments herein refer to the semiconductor substrate 205 and the semiconductor layer 215 as crystalline silicon, the disclosure is not limited to such. For example, other semiconductors or optically transmissive materials may be used to form the SOI device of the diagram 200. Moreover, the semiconductor substrate 205 and the semiconductor layer 215 may be made of a same material, but in other embodiments, the semiconductor substrate 205 and the semiconductor layer 215 may be made of different materials.

The thickness of the semiconductor layer 215 may range from less than 100 nanometers to greater than a micron. In some cases, the semiconductor layer 215 may have a thickness between about 100-300 nanometers. The thickness of the insulator layer 210 may vary depending on the desired application. Generally, the thickness of the insulator layer 210 may range from less than one micron to tens of microns. The thickness of the semiconductor substrate 205 may vary widely depending on the specific application of the SOI device of the diagram 200. For example, the semiconductor substrate 205 may be the thickness of a typical semiconductor wafer (e.g., between about 100-700 microns) or may be thinned and mounted on another substrate in some embodiments described herein.

For photonic applications, the semiconductor layer 215 of the SOI device of the diagram 200 may be etched or otherwise processed to form one or more waveguides. Because some semiconductor materials (e.g., silicon) have a higher refractive index compared to some insulator materials (e.g., silicon dioxide, silicon oxynitride), optical signals remain primarily in the one or more waveguides as the optical signals propagate through the semiconductor layer 215.

Diagram 220 illustrates further processing of the SOI device of the diagram 200. In the diagram 220, a plurality of optical devices 230-1, 230-2, 230-3 are formed partly in the semiconductor layer 215. Some non-limiting examples of the optical devices 230-1, 230-2, 230-3 include optical generators, optical amplifiers, optical detectors, and optical modulators. In some cases, the plurality of optical devices 230-1, 230-2, 230-3 may be made from materials other than silicon (e.g., germanium), or a combination of silicon with other materials.

Once the semiconductor layer 215 is processed to include the plurality of optical devices 230-1, 230-2, 230-3, the plurality of optical devices 230-1, 230-2, 230-3 are covered by an insulator layer 225 (e.g., an oxide layer), which also serves as a suitable base for mounting additional circuitry on the SOI device.

A plurality of conductive vias 240-1 are formed into the insulator layer 225 and coupled with the optical device 230-1, and a plurality of conductive vias 240-2 are formed into the insulator layer 225 and coupled with the optical device 230-2. Further, a first optical waveguide 235-1 is formed in the insulator layer 225 using any suitable techniques. In some embodiments, the first optical waveguide 235-1 comprises a silicon nitride material. In some embodiments, the first optical waveguide 235-1 is optically coupled with one or more of the plurality of optical devices 230-1, 230-2, 230-3.

Diagram 245 illustrates further processing of the SOI device of the diagram 220. An insulator layer 250 (e.g., an oxide layer) and a plurality of metal layers 255-1, 255-2 are formed. The metal layer 255-1 comprises conductive contacts that are coupled with the conductive vias 240-1, 240-2, and the metal layer 255-2 comprises conductive contacts that are coupled with the metal layer 255-1 through one or more conductive vias. Additional first optical waveguides 235-2, 235-3 are formed in the insulator layer 250 using any suitable techniques.

FIGS. 3A-3E illustrate an exemplary sequence of fabricating an optical apparatus using a blank interposer wafer, according to one or more embodiments. The sequence depicted in FIGS. 3A-3E may be used in conjunction with other embodiments, e.g., using the photonic wafer assembly 260 illustrated in the diagram 245 of FIG. 2C.

Diagram 300 illustrates bonding a photonic wafer assembly 260 with a blank interposer wafer 315, which provides one example of the interposer wafer 120 of FIG. 1. A first exterior surface 310 of the photonic wafer assembly 260 is bonded with a first surface 320 of the interposer wafer 315. The interposer wafer 315 comprises a second surface 325 opposite the first surface 320.

In some embodiments, oxide-oxide bonding is used to bond the photonic wafer assembly 260 with the interposer wafer 315. In one embodiment, the interposer wafer 315 comprises silicate glass that is bonded with an oxide layer of the photonic wafer assembly 260. In another embodiment, a relatively thin layer of oxide is deposited (e.g., via plasma-enhanced chemical vapor deposition (PECVD)) on the surface of the interposer wafer 315 to improve bonding with the photonic wafer assembly 260.

Diagram 330 illustrates further processing of the optical apparatus 333 formed in the diagram 300. A bond line 335 indicates a location of the bonding of the first exterior surface 310 of the photonic wafer assembly 260 with the first surface of the interposer wafer 315.

As shown, the photonic wafer assembly 260 is in an inverted configuration from that shown in the diagram 245 of FIG. 2C. In the diagram 330, the semiconductor substrate 205 is removed from the optical apparatus 333, leaving a portion 305 of the photonic wafer assembly 260. An insulator layer (e.g., the insulator layer 210 of the photonic wafer assembly 260) is increased or otherwise deposited on the portion 305. In some embodiments, the insulator layer comprises an oxide layer. A conductive via 340 is formed through the insulator layer and extends to the metal layer 255-2. The conductive via 340 is coupled with a metal layer 255-3 formed in the insulator layer, which is further coupled with one or more conductive pads 345 that are accessible from a second exterior surface 350 of the photonic wafer assembly 260. The second exterior surface 350 is opposite the first exterior surface 310. As shown, the one or more conductive pads 345 are disposed in a recessed region 355 that is recessed from the second exterior surface 350. In other embodiments, the one or more conductive pads 345 are disposed at the second exterior surface 350.

Diagram 360 illustrates further processing of the optical apparatus 333 depicted in the diagram 330. As shown, the optical apparatus 333 is in an inverted configuration from that shown in the diagram 330. A conductive via 370 is formed from the second surface 325 of the interposer wafer 315, extending fully through the interposer wafer 315 and partway through the insulator layer of the optical apparatus 333. The conductive via 370 is coupled with the metal layer 255-3.

A plurality of conductive pads 365-1, 365-2, 365-3, 365-4 are formed at the second surface 325. The plurality of conductive pads 365-1, 365-2, 365-3, 365-4 are spaced with a pitch illustrated as a distance d1. The conductive pad 365-1 is coupled with the metal layer 255-3 thorough the conductive via 370. Although not shown, the other conductive pads 365-2, 365-3, 365-4 may be coupled with any of the metal layers 255-1, 255-2, 255-3. Further, although not shown, one or more redistribution layers may be included in the interposer wafer 315 to provide routing to the plurality of conductive pads 365-1, 365-2, 365-3, 365-4.

A distance d2 represents a thickness of the interposer wafer 315, and a distance d3 represents a thickness of the photonic wafer assembly 260. In one non-limiting example, the distance d2 is between about 0.5 millimeter (mm) and 1 mm, and the distance d3 is between about 10 microns and 20 microns, although other thicknesses are contemplated.

Diagram 375 illustrates further processing of the optical apparatus 333 depicted in the diagram 360. In the diagram 375, a plurality of solder balls 380-1, 380-2, 380-3, 380-4 are coupled to the plurality of conductive pads 365-1, 365-2, 365-3, 365-4. In one embodiment, the plurality of solder balls 380-1, 380-2, 380-3, 380-4 are arranged as a ball grid array (BGA). In diagram 382, the optical apparatus 333 is mounted to the PCB 125 using the plurality of solder balls 380-1, 380-2, 380-3, 380-4. Other types of surface mounting techniques for establishing electrical connections with the plurality of conductive pads 365-1, 365-2, 365-3, 365-4 are also contemplated.

In the diagram 382, a fiber array unit (FAU) 385 retains a plurality of optical fibers 390 in a predefined arrangement. The plurality of optical fibers 390 are optically coupled with the optical waveguides 235-1, 235-2, 235-3 of the optical apparatus 333. In some embodiments, passive and/or active optical alignment processes may be used to provide the optical coupling between the plurality of optical fibers 390 and the optical waveguides 235-1, 235-2, 235-3. In some embodiments, the FAU 385 is adhered to the optical apparatus 333 using an index-matching epoxy, through which the plurality of optical fibers 390 maintain their optical coupling with the optical waveguides 235-1, 235-2, 235-3.

A laser 395 is connected with the optical apparatus 333 at the second surface 325, and is optically coupled with one or more of the optical devices of the optical apparatus 333 (e.g., the optical devices 230-1, 230-2, 230-3 of FIG. 2B). In some embodiments, the laser 395 comprises a semiconductor-based laser. In some embodiments, the laser 395 is coupled with the optical apparatus 333 and/or the PCB 125 via one or more conductive connections, receiving power and/or high-speed signaling thereby.

FIGS. 4A-4D illustrate an exemplary sequence of fabricating an optical apparatus using a preprocessed interposer wafer, according to one or more embodiments. The sequence depicted in FIGS. 4A-4D may be used in conjunction with other embodiments, e.g., using the photonic wafer assembly 260 illustrated in the diagram 245 of FIG. 2C.

Diagram 400 illustrates bonding the photonic wafer assembly 260 with the interposer wafer 315, which provides one example of the interposer wafer 120 of FIG. 1. A first exterior surface 310 of the photonic wafer assembly 260 is bonded with a first surface 320 of the interposer wafer 315. The interposer wafer 315 comprises a second surface 325 opposite the first surface 320.

In the diagram 400, one or more optical waveguides 405 and/or one or more conductive vias 410-1, 410-2 are formed in the interposer wafer 315 prior to bonding. The one or more conductive vias 410-1, 410-2 extend at least partway through the interposer wafer 315.

In some embodiments, one or more optical waveguides (e.g., the optical waveguide 235-3) of the photonic wafer assembly 260 have a first height relative to the first exterior surface 310, and the one or more optical waveguides 405 of the interposer wafer 315 have a second height relative to the first surface 320, such that the one or more optical waveguides of the photonic wafer assembly 260 are evanescently coupled with the one or more optical waveguides 405 of the interposer wafer 315. For example, a chemical-mechanical polishing (CMP) process or other suitable process may be performed on the photonic wafer assembly 260 such that the optical waveguide 235-3 is less than about 1 micron from the first exterior surface 310. In one embodiment, the optical waveguide 235-3 is about 0.5 micron or less from the first exterior surface 310. In one embodiment, the optical waveguide 235-3 is about 0.3 micron or less from the first exterior surface 310.

Diagram 415 illustrates further processing of the optical apparatus 435 formed in the diagram 400. The bond line 335 indicates a location of the bonding of the first exterior surface 310 of the photonic wafer assembly 260 with the first surface of the interposer wafer 315.

In the diagram 415, the semiconductor substrate 205 is removed from the optical apparatus 435, leaving a portion 305 of the photonic wafer assembly 260. An insulator layer (e.g., the insulator layer 210 of the photonic wafer assembly 260) is increased or otherwise added to the portion 305. In some embodiments, the insulator layer comprises an oxide layer. The conductive via 340 is formed through the insulator layer and extends to the metal layer 255-2. The conductive via 340 is coupled with a metal layer 255-3 formed in the insulator layer, which is further coupled with one or more conductive pads 345 that are accessible from the second exterior surface 350 of the photonic wafer assembly 260.

One or more conductive vias 420-1, 420-2 couple the metal layer 255-3 with the conductive vias 410-1, 410-2 of the interposer wafer 315. In some embodiments, the plurality of conductive vias 420-1, 420-2 extend partway through the photonic wafer assembly 265 and partway through the interposer wafer 315. In other embodiments, the plurality of conductive vias 420-1, 420-2 extend partway through the photonic wafer assembly 265 and couple with the plurality of conductive vias 410-1, 410-2 at the surface 320.

In some embodiments, the interposer wafer 315 comprises one or more mechanical features that are dimensioned to optically couple one or more optical fibers with the one or more optical waveguides 405. In some embodiments, at least one of the one or more mechanical features is formed prior to bonding the interposer wafer 315 with the photonic wafer assembly 260. In other embodiments, at least one of the one or more mechanical features is formed after bonding the interposer wafer 315 with the photonic wafer assembly 260.

In some embodiments, the one or more mechanical features comprise a recessed portion 425 into which the one or more optical fibers into which the one or more optical fibers are partly received. In some embodiments, the one or more mechanical features comprise one or more grooves 430 into which the one or more optical fibers are partly received.

Diagram 440 illustrates further processing of the optical apparatus 435 depicted in the diagram 415. A plurality of conductive pads 365-1, 365-2, 365-3, 365-4 are formed at the second surface 325. The conductive pad 365-1 is coupled with the metal layer 255-3 through the conductive vias 410-2, 420-2. The conductive pad 365-2 is coupled with the metal layer 255-3 through the conductive vias 410-1, 420-1. Although not shown, the other conductive pads 365-3, 365-4 may be coupled with any of the metal layers 255-1, 255-2, 255-3.

A plurality of solder balls 380-1, 380-2, 380-3, 380-4 are coupled to the plurality of conductive pads 365-1, 365-2, 365-3, 365-4. In one embodiment, the plurality of solder balls 380-1, 380-2, 380-3, 380-4 are arranged as a ball grid array (BGA). In diagram 445, the optical apparatus 435 is mounted to the PCB 125 using the plurality of solder balls 380-1, 380-2, 380-3, 380-4. Other types of surface mounting techniques for establishing electrical connections with the plurality of conductive pads 365-1, 365-2, 365-3, 365-4 are also contemplated.

In some embodiments, some or all of the plurality of optical fibers 390 extend from the FAU 385 when in the predefined arrangement. As shown, a portion 450 of the plurality of optical fibers is received in the recessed portion 425, and is one received into the one or more grooves 430 to provide optical alignment of the plurality of optical fibers 390 with the one or more optical waveguide 405.

Figure 5A:
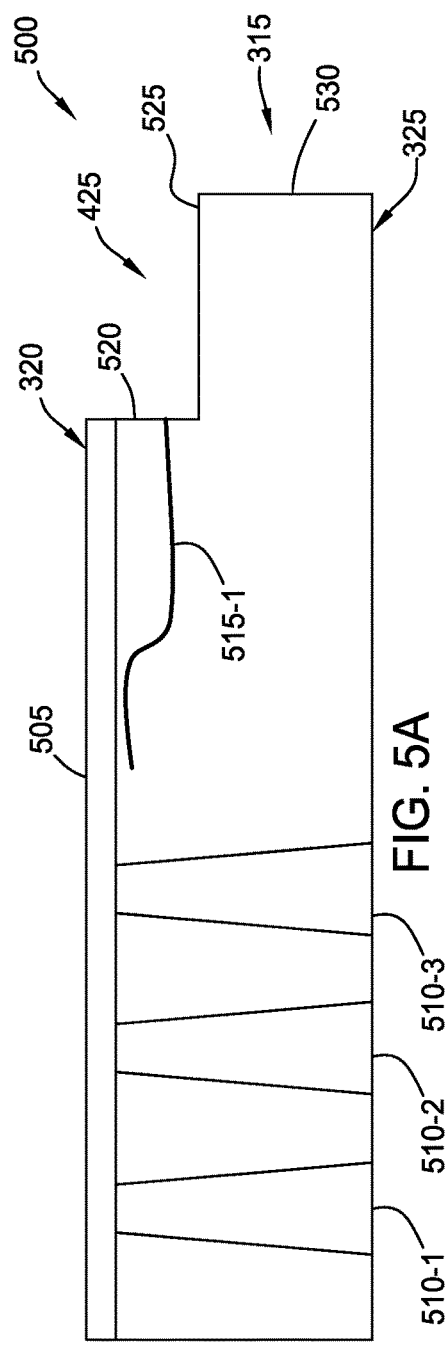
FIGS. 5A and 5B are views of an exemplary interposer wafer, according to one or more embodiments.
Figure 5B:
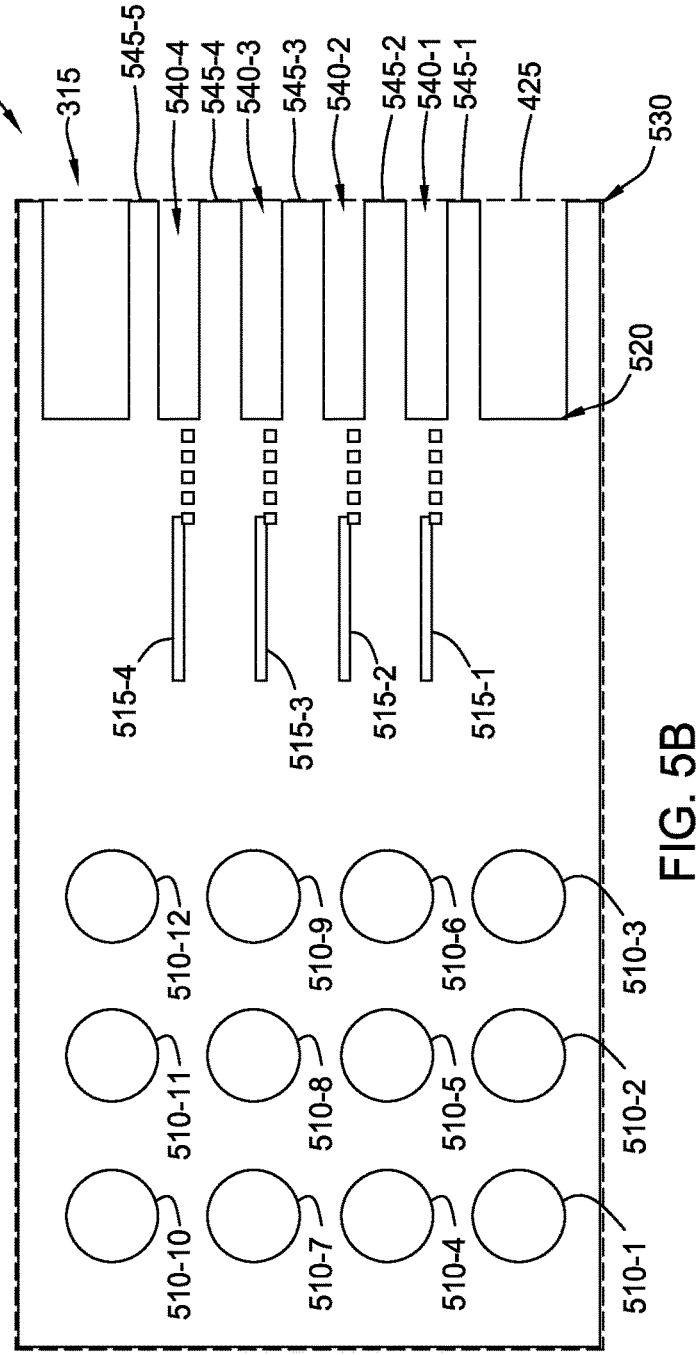

FIGS. 5A and 5B are views 500, 535 of an exemplary interposer wafer, according to one or more embodiments. More specifically, the view 500 provides a cross-sectional view of the interposer wafer 315 (with an oxide layer 505), and the view 535 provides a top view of the interposer wafer 315 (without the oxide layer 505). The features discussed with respect to FIGS. 5A, 5B may be used in conjunction with other embodiments, such as bonded with the photonic wafer assembly 260.

In some embodiments, the oxide layer 505 is deposited on the surface of the interposer wafer 315 to improve bonding with the photonic wafer assembly 260. In such a case, the oxide layer 505 defines the first surface 320. A plurality of conductive vias 510-1, 510-2, . . . , 510-12 are formed partway through the interposer wafer 315. As shown, the plurality of conductive vias 510-1, 510-2, . . . , 510-12 are arranged in a repeating pattern of four (4) rows and three (3) columns. Other embodiments may have alternate arrangements, which in some cases may be non-repeating.

In some embodiments, the recessed portion 425 is recessed from an endface 530 of the interposer wafer 315 to a recessed face 520. A plurality of waveguides 515-1, 515-2, 515-3, 515-4 are included in the interposer wafer 315 and extend to the recessed face 520. The plurality of waveguides 515-1, 515-2, 515-3, 515-4 may also extend close to the first surface 320 to enable evanescent coupling with one or more optical components of a photonic wafer assembly bonded to the interposer wafer 315. In other embodiments, the plurality of waveguides 515-1, 515-2, 515-3, 515-4 have an alternate orientation and/or arrangement, e.g., extending toward the first surface 320 to optically couple with the photonic wafer assembly 260 in a vertical direction.

The recessed portion 425 is also recessed from the first surface 320 to a recessed surface 525. A plurality of ribs 545-1, 545-2, 545-3, 545-4, 545-5 or other suitable features extend to the recessed surface 525. The plurality of ribs 545-1, 545-2, 545-3, 545-4, 545-5 define a plurality of grooves 540-1, 540-2, 540-3, 540-4 into which optical fibers are partly received. The plurality of grooves 540-1, 540-2, 540-3, 540-4 are recessed further from the recessed surface 525 and may have any suitable shape such as V-shaped or U-shaped. In some embodiments, the plurality of ribs 545-1, 545-2, 545-3, 545-4, 545-5 also define a plurality of grooves 550-1, 550-2 that are wider than the plurality of grooves 540-1, 540-2, 540-3, 540-4. For example, the plurality of grooves 550-1 may be dimensioned to receive portions of a proprietary or standardized optical connector, such as pins of a Multi-fiber Push On (MPO) connector.

Figure 6:
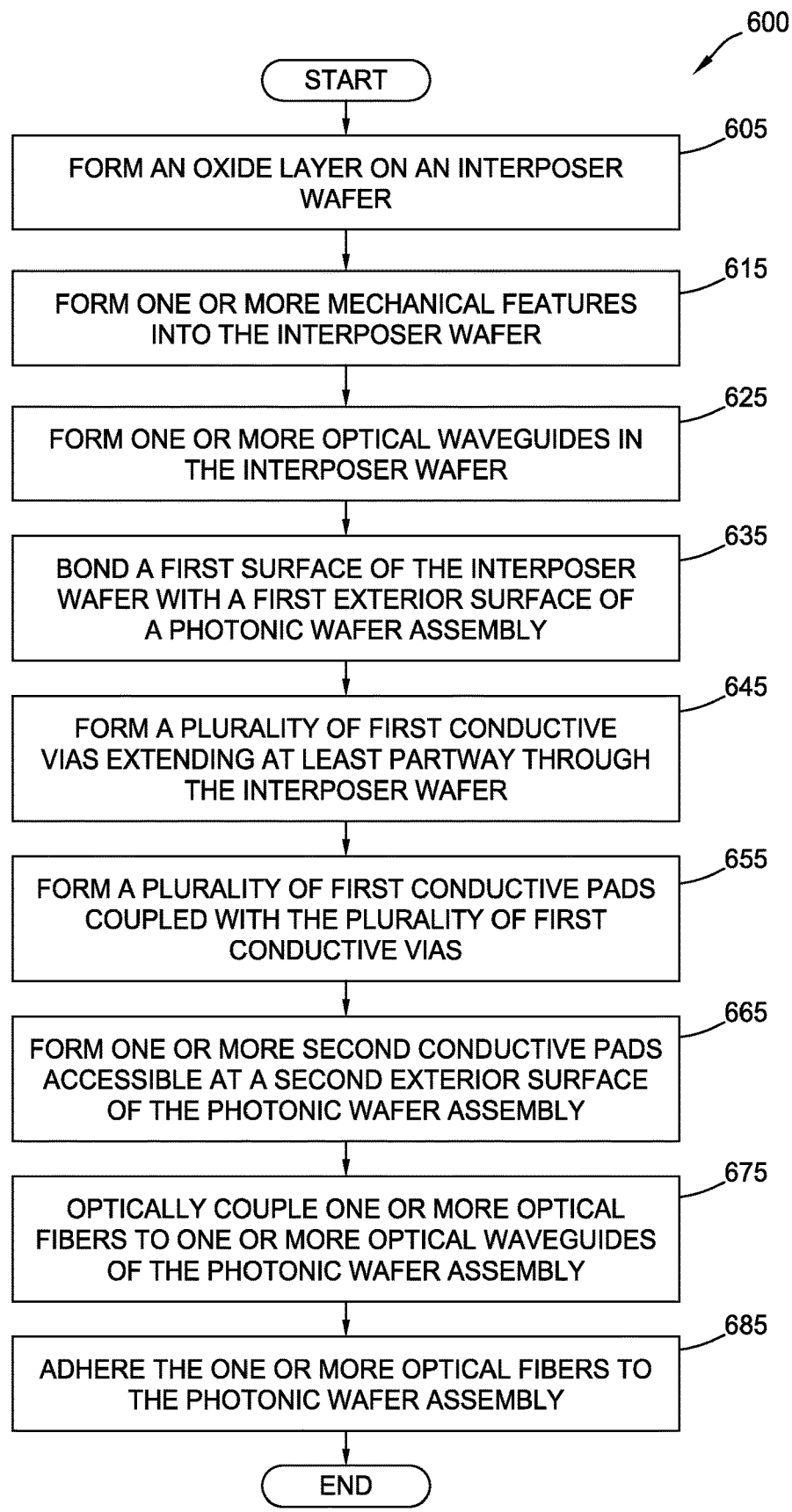
FIG. 6 is a method of fabricating an optical apparatus with an interposer wafer, according to one or more embodiments.

FIG. 6 is a method 600 of fabricating an optical apparatus with an interposer wafer, according to one or more embodiments. The features described in the method 600 may be used in conjunction with other embodiments.

The method 600 begins at block 605, where an oxide layer is formed on an interposer wafer. In some embodiments, the interposer wafer comprises a silicate glass, and the forming the oxide layer comprises depositing the oxide layer onto the silicate glass using a PECVD process or other suitable process.

At block 615, one or more mechanical features are formed into the interposer wafer. The one or more mechanical features may include a recessed portion into which one or more optical fibers are partly received, and/or one or more grooves into which the one or more optical fibers are partly received.

At block 625, one or more optical waveguides are formed in the interposer wafer. In some embodiments, forming the one or more optical waveguides comprises laser patterning.

At block 635, a first surface of the interposer wafer is bonded with a first exterior surface of a photonic wafer assembly. In some embodiments, the first surface and the first exterior surface are bonded using oxide-oxide bonding at the wafer level. In one example, the first surface of the interposer wafer is defined by the formed oxide layer. In another example, the first surface of the interposer wafer is defined by the silicate glass.

At block 645, a plurality of first conductive vias are formed. The plurality of first conductive vias extends at least partway through the interposer wafer. At block 655, a plurality of first conductive pads are formed that are coupled with the plurality of first conductive vias.

At block 665, one or more second conductive pads are formed that are accessible at a second exterior surface of the photonic wafer assembly. In some embodiments, the one or more second conductive pads are disposed in a recessed region that is recessed from the second exterior surface. In other embodiments, the one or more second conductive pads are disposed at the second exterior surface.

At block 675, one or more optical fibers are optically coupled to one or more optical waveguides of the photonic wafer assembly. In some embodiments, the one or more optical fibers are included in a FAU. In some embodiments, the optical coupling comprises an active optical alignment process. In some embodiments, the optical coupling comprises a passive alignment process. In some embodiments, the passive alignment process may be achieved using the one or more mechanical features formed into the interposer wafer. At block 685, the one or more optical fibers are adhered to the photonic wafer assembly. In some embodiments, adhering the one or more optical fibers comprises applying an index-matching epoxy, through which the one or more optical fibers maintain their optical coupling with the one or more optical waveguides. The method 600 ends following completion of block 685.

In the preceding, reference is made to embodiments presented in this disclosure. However, the scope of the present disclosure is not limited to specific described embodiments. Instead, any combination of the described features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

Aspects of the present disclosure are described above with reference to flowchart illustrations and/or block diagrams of methods, apparatus (systems) and computer program products according to embodiments presented in this disclosure.

It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer, other programmable data processing apparatus, or other devices to function in a particular manner, such that the instructions stored in the computer-readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality and operation of possible implementations of systems, methods and computer program products according to various embodiments. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In view of the foregoing, the scope of the present disclosure is determined by the claims that follow.

We claim:

1. A method comprising:
    forming an insulator layer above a silicon layer of a silicon-on-insulator (SOI) substrate, wherein a first optical device is formed partly in the silicon layer and partly in the insulator layer, and wherein a first optical waveguide is formed in the insulator layer and optically coupled with the first optical device;
    forming conductive contacts extending partly through the insulator layer to the first optical device;
    bonding a first surface of an interposer with a top surface of the insulator layer; and
    forming, from a second surface of the interposer opposite the first surface, a plurality of first conductive vias extending at least partly through the interposer, wherein the plurality of first conductive vias are coupled with the conductive contacts.

2. The method of claim 1, wherein forming the plurality of first conductive vias occurs after bonding the first surface of the interposer with the top surface of the insulator layer.

3. The method of claim 2, wherein the first plurality of conductive vias extend partly through the insulator layer to the conductive contacts.

4. The method of claim 1, wherein forming the plurality of first conductive vias occurs before bonding the first surface of the interposer with the top surface of the insulator layer.

5. The method of claim 4, further comprising:
    forming, after bonding the first surface of the interposer with the top surface of the insulator layer, a plurality of second conductive vias that are coupled with the plurality of first conductive vias, and
    wherein the plurality of second conductive vias extend partly through the insulator layer and partly through the interposer.

6. The method of claim 1, further comprising:
    forming, at the second surface of the interposer, a plurality of first conductive pads coupled with the plurality of first conductive vias; and
    forming one or more second conductive pads coupled with one or more metal layers, wherein the one or more second conductive pads are accessible at a surface of an insulator layer of the SOI substrate.

7. The method of claim 1, wherein the interposer comprises an optically transmissive material, the method further comprising:
    forming at least a second optical waveguide in the interposer,
    wherein the second optical waveguide is optically coupled with the first optical device.

8. The method of claim 7, wherein the optically transmissive material comprises a silicate glass, and
    wherein forming the second optical waveguide comprises laser patterning.

9. The method of claim 1, wherein bonding the first surface of the interposer comprises oxide-oxide wafer-level bonding.

10. The method of claim 1, further comprising:
    dicing the SOI substrate into a plurality of SOI devices,
    wherein the first optical device, the first optical waveguide, the conductive contacts, and plurality of first conductive vias are included in a first SOI device of the plurality of SOI devices.

11. An optical apparatus comprising:
    a silicon layer of a silicon-on-insulator (SOI) substrate;
    an insulator layer formed above the silicon layer;
    a first optical device formed partly in the silicon layer and partly in the insulator layer;
    conductive contacts extending partly through the insulator layer to the first optical device;
    an interposer having a first surface bonded with a top surface of the insulator layer; and
    a plurality of first conductive vias extending, from a second surface of the interposer opposite the first surface, at least partly through the interposer,
    wherein the plurality of first conductive vias are coupled with the conductive contacts.

12. The optical apparatus of claim 11, wherein the first plurality of conductive vias extend partly through the insulator layer to the conductive contacts.

13. The optical apparatus of claim 11, further comprising:
a plurality of second conductive vias that are coupled with the plurality of first conductive vias,
wherein the plurality of second conductive vias extend partly through the insulator layer and partly through the interposer.

14. The optical apparatus of claim 11, further comprising:
a plurality of first conductive pads formed at the second surface of the interposer, the plurality of first conductive pads coupled with the plurality of first conductive vias; and
one or more second conductive pads coupled with one or more metal layers, wherein the one or more second conductive pads are accessible at a surface of an insulator layer of the SOI substrate.

15. The optical apparatus of claim 11,
wherein the interposer comprises an optically transmissive material, and
wherein at least a second optical waveguide is formed in the interposer and is optically coupled with the first optical device.

16. The optical apparatus of claim 15, wherein the optically transmissive material comprises a silicate glass, and
wherein the second optical waveguide is formed using laser patterning.

17. The optical apparatus of claim 11, wherein the first surface is bonded with the top surface via oxide-oxide bonding.

18. An apparatus comprising:
a silicon layer of a silicon-on-insulator (SOI) substrate;
an insulator layer formed above the silicon layer;
a first optical device formed partly in the silicon layer and partly in the insulator layer;
a first optical waveguide formed in the insulator layer and optically coupled with the first optical device;
conductive contacts extending partly through the insulator layer to the first optical device;
an interposer having a first surface bonded with a top surface of the insulator layer;
a plurality of first conductive vias extending, from a second surface of the interposer opposite the first surface, at least partly through the interposer, wherein the plurality of first conductive vias are coupled with the conductive contacts;
a plurality of first conductive pads formed at the second surface of the interposer, the plurality of first conductive pads coupled with the plurality of first conductive vias; and
an integrated circuit coupled with the one or more first conductive pads.

19. The apparatus of claim 18, further comprising:
a first optical fiber optically coupled with the first optical waveguide, the first optical fiber adhered to one or both of the insulator layer and the interposer.

20. The apparatus of claim 19,
wherein the first optical fiber is included in a plurality of optical fibers arranged in a fiber array unit (FAU), and
wherein the FAU is adhered to one or both of the insulator layer and the interposer.

* * * * *